United States Patent [19]

Tsuchida et al.

[11] Patent Number: 5,432,680
[45] Date of Patent: Jul. 11, 1995

[54] ELECTRONIC ASSEMBLY INCLUDING LEAD TERMINALS SPACED APART IN TWO DIFFERENT MODES

[75] Inventors: Toru Tsuchida; Hiroyoshi Shigeyama, both of Kyoto, Japan

[73] Assignee: Murata Manufacturing Co., Ltd., Kyoto, Japan

[21] Appl. No.: 97,290

[22] Filed: Jul. 26, 1993

[30] Foreign Application Priority Data

Jul. 27, 1992 [JP] Japan .................................. 4-220663

[51] Int. Cl.⁶ ........................ H01R 9/00; H01R 9/09
[52] U.S. Cl. .......................... 361/776; 257/692; 361/774; 361/772; 439/65; 439/68; 439/72
[58] Field of Search .................. 29/827, 842, 843, 857; 174/261; 228/179.1, 180.1, 180.2; 257/691–696; 361/772, 774, 776, 807, 809, 810, 813; 439/59, 60, 62, 65, 68, 75, 78, 81, 83, 84, 72

[56] References Cited

FOREIGN PATENT DOCUMENTS 3033881 4/1982 Germany .................................. 439/55

Primary Examiner—Leo P. Picard
Assistant Examiner—Donald A. Sparks
Attorney, Agent, or Firm—Ostrolenk, Faber, Gerb & Soffen

[57] ABSTRACT

A pair of holding members, which are displaced from each other along the horizontal plane of a plate face, are formed on each forward end of a plurality of plate type lead terminals fixed to a long base tape. An electronic component body is resiliently held by the paired holding members which are bent in opposite directions in relation to the plate thickness direction. The lead terminals are divided into first and second groups; bending modes for the pairs of holding members provided on the lead terminals belonging to the first group are opposite to those for the pairs of holding members provided on the lead terminals belonging to the second group in relation to the plate thickness direction. Thus, it is possible to suppress distortion of the electronic component with respect to the base tape.

6 Claims, 5 Drawing Sheets

ELECTRONIC ASSEMBLY INCLUDING LEAD TERMINALS SPACED APART IN TWO DIFFERENT MODES

BACKGROUND OF THE INVENTION

1. Field of the Invention

The present invention relates to a taped electronic component.

2. Description of the Background Art

FIGS. 6 to 11 illustrate steps of manufacturing a conventional taped electronic component, with FIG. 6 showing a conventional plate type lead terminal structure. The lead terminal structure, which is manufactured by punching a thin metal plate by a press, comprises a long connecting member 1 and a plurality of lead terminals 2 integrally formed on one side of the connecting member 1 at prescribed intervals.

Each of the lead terminals 2 is integrally provided on its forward end with a pair of holding members 3 and 4, which are separated from each other along the horizontal plane of the plate, as shown in FIG. 6. As clearly understood from FIG. 7, each pair of the holding members 3 and 4 are bent in opposite directions in relation to the plate thickness direction.

The aforementioned lead terminals 2 resiliently hold an electronic component body 5 with the pairs of holding members 3 and 4 as shown in FIG. 8, and are soldered to electrodes 6. The body 5, which is adapted to form a hybrid integrated circuit, a C (capacitor) network, an R (resistor) network or the like, is covered with an insulating coating 7 as shown in FIG. 9 after the body 5 is provided with the terminals 2 as shown in FIG. 8.

Thereafter, the connecting member 1 is separated from the respective terminals 2 so as to provide an independent electronic component A, and the ends of the terminals 2 forming this electronic component A are placed on a long base tape 8 and attached to the tape 8 with an adhesive tape 9 from above. A plurality of such electronic components A are thus fixed onto the base tape 8 at prescribed pitches, to form a taped electronic component.

Feed pins (not shown) are engaged with feed holes 10 provided in the base tape 8 and moved so as to introduce the taped electronic component, manufactured in the aforementioned manner, into an automatic inserter, which in turn automatically inserts the respective electronic components A into printed circuit plates.

In each of the electronic components A, which form the conventional taped electronic component, as hereinabove described, the pairs of holding members 3 and 4, which are provided on the forward end of each lead terminal 2, are separated from each other along the horizontal plane of the plate. Further, the holding members 3 and 4 are bent so as to resiliently hold the body 5. Accordingly, each of the bent holding members 3 and 4 exerts a resilient force on the body 5 based on its resilience that tends to twist the body 5.

Thus, the electronic components A could be distorted with respect to the base tape 8 by the concerted twisting of force from the terminals 2, as shown in FIG. 11, and the degrees of such distortion may vary with the various electronic components A. When the taped electronic component is introduced into an automatic inserter, therefore, such distorted electronic components A may be unsatisfactorily chucked so as to cause imperfect insertion in printed wiring boards, leading to a reduction in insertion efficiency.

SUMMARY OF THE INVENTION

In order to solve the aforementioned problem of the prior art, an object of the present invention is to provide a taped electronic component which can suppress distortion of electronic components with respect to a base tape and reduce the imperfect insertion.

A taped electronic component according to the present invention comprises a plurality of electronic components and a long base tape holding these electronic components. Each of the plurality of electronic components comprises an electronic component body and a plurality of plate type lead terminals. Each of the lead terminals is provided on its first end portion with a pair of holding members which are displaced from each other along the plate face direction. The pair of holding members are bent in opposite directions in relation to the plate thickness direction, so as to resiliently hold the electronic component body therebetween. The base tape fixes second end portions of the lead terminals so as to arrange the plurality of electronic components along its longitudinal direction.

A noticeable feature of the present invention resides in the bending modes of the holding members in relation to the plate thickness direction. The plurality of lead terminals provided on each electronic component are divided into a first group and a second group. Bending modes for the pair of holding members which are formed on each lead terminal belonging to the first group are opposed to those for the pair of holding members formed on each lead terminal belonging to the second group, in relation to the plate thickness direction.

According to the present invention, therefore, it is possible to cancel the torques which are applied from the pairs of holding members on the electronic component body with each other, thereby suppressing distortion of each electronic component with respect to the base tape. Consequently, it is possible to substantially prevent imperfect insertion when the electronic components are automatically inserted into printed wiring boards from the taped electronic component handled by an automatic inserter.

According to the present invention, the lead terminals of the first group and those of the second group are preferably arranged in an alternate manner. Further, the lead terminals of the first group are preferably substantially identical in number to those of the second group.

The foregoing and other objects, features, aspects and advantages of the present invention will become more apparent from the following detailed description of the present invention when taken in conjunction with the accompanying drawings.

DESCRIPTION OF THE PREFERRED EMBODIMENT

Figure 1:
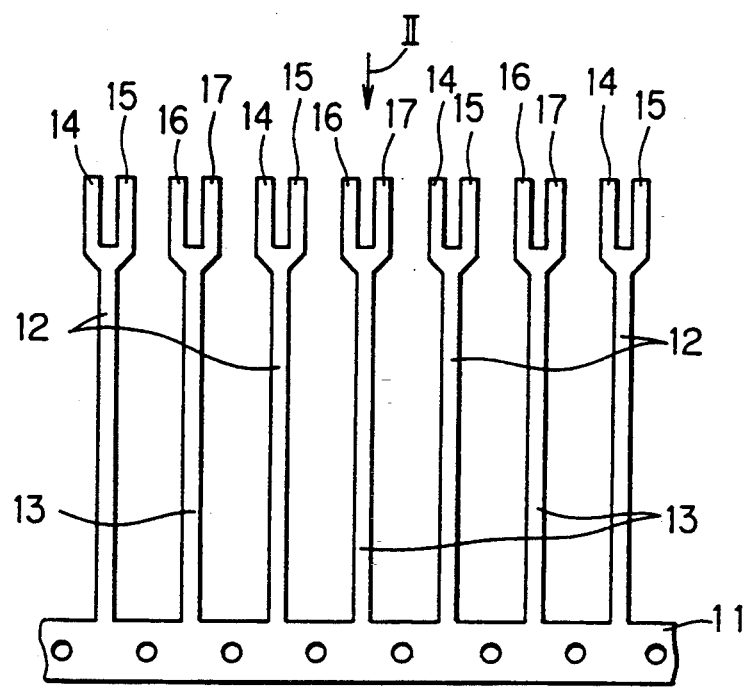
FIG. 1 is a plan view showing lead terminals 12 and 13 employed in an embodiment of the present invention.
Figure 2:
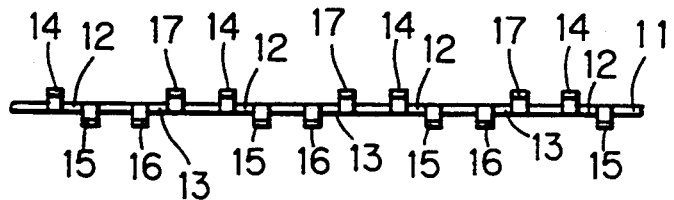
FIG. 2 is a top plan view of the lead terminals 12 and 13 as viewed along arrow II in FIG. 1.

Referring to FIGS. 1 to 5, plate type lead terminals 12 and 13 are prepared by punching a thin metal plate with a press, similarly to the prior art. These lead terminals 12 and 13 are alternately integrally formed on one side of a long connecting member 11 at prescribed intervals.

Each of the lead terminals 12, belonging to a first group, is integrally provided on its forward end with a pair of holding members 14 and 15. Each of the lead terminals 13, belonging to a second group, is also integrally provided on its forward end with a pair of holding members 16 and 17.

The pairs of holding members 14, 15, 16 and 17, which are respectively provided on the forward ends of the lead terminals 12 and 13, are bent in opposite directions in relation to the direction of the plate thickness, to define clearances for holding an electronic component body 18, as hereinafter described. It is to be noted that the holding members 14 and 15, which are provided on the lead terminals 12, are bent in opposite modes to those for the holding members 16 and 17, respectively, which are provided on the lead terminals 13, as clearly understood from FIG. 2.

Figure 3:
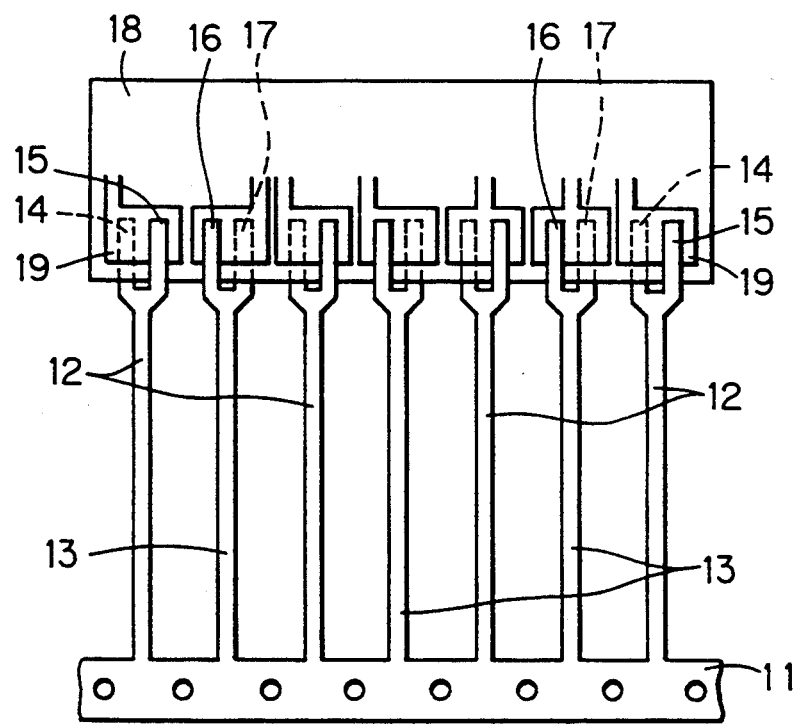
FIG. 3 is a plan view showing the lead terminals 12 and 13, appearing in FIG. 1, attached to an electronic component body 18.
Figure 4:
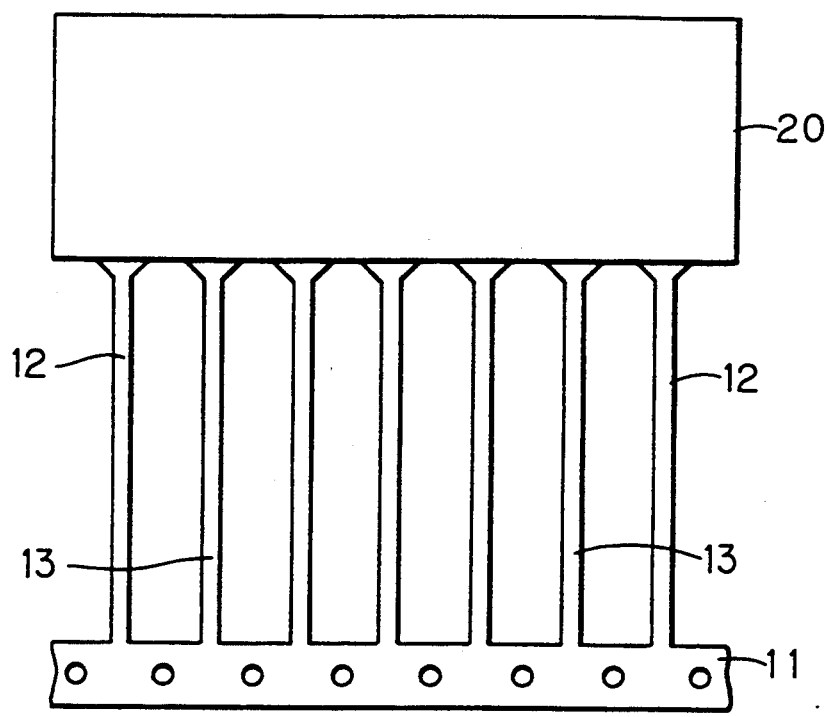
FIG. 4 is a plan view showing the body 18, appearing in FIG. 3, covered with an insulating coating 20.

As shown in FIG. 3, the holding members 14, 15, 16 and 17 of the lead terminals 12 and 13, respectively, resiliently hold the electronic component body 18, and are soldered to electrodes 19 provided on the electronic component body 18. The electronic component body 18, which is adapted to form a hybrid integrated circuit, a C network, an R network or the like, is covered with an insulating coating 20 of resin or the like as shown in FIG. 4, as may be suitable or desirable after the electronic component body 18 has been provided with the lead terminals 12 and 13 in the aforementioned manner.

Figure 5:
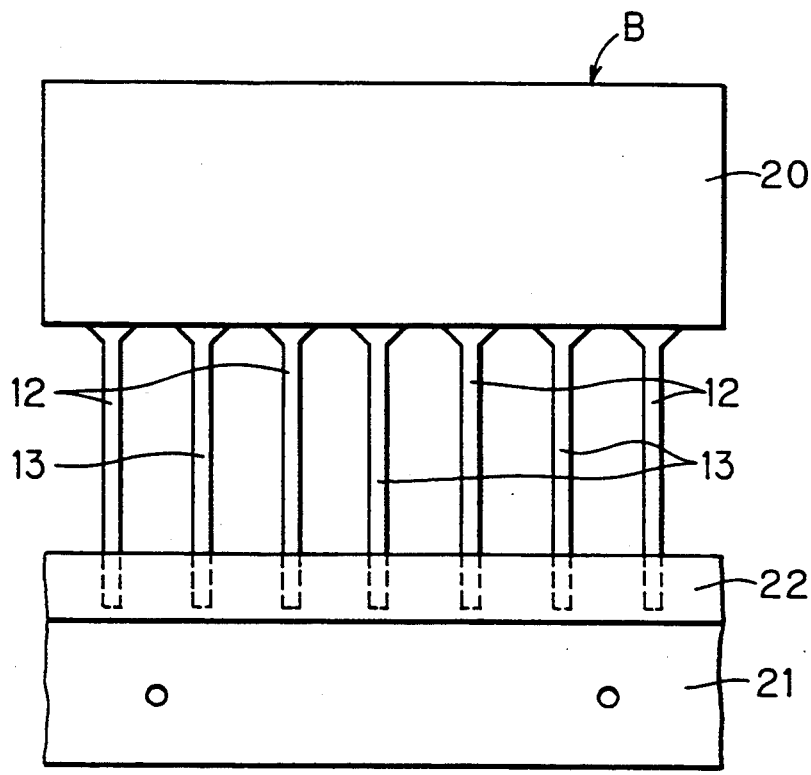
FIG. 5 is a plan view of the finished taped electronic component according to an embodiment of the present invention.
Figure 6:
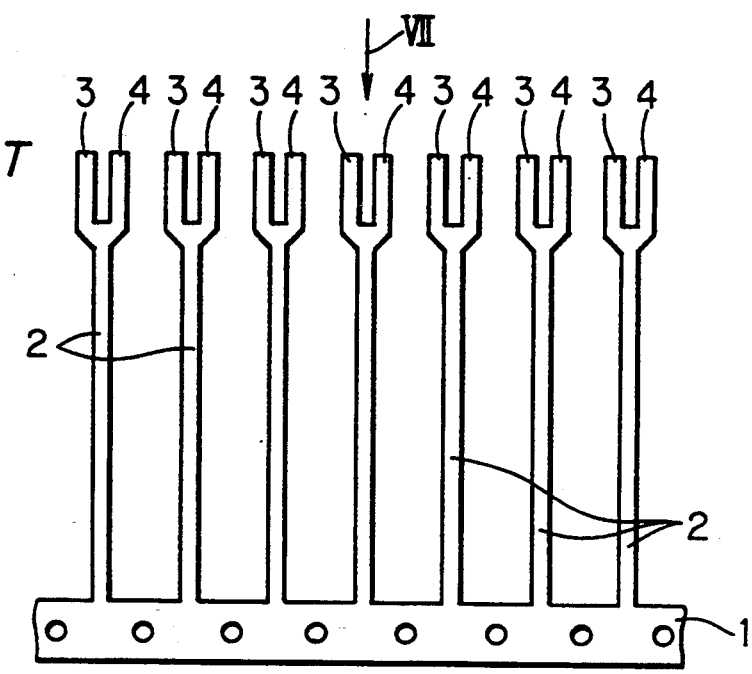
FIG. 6 is a plan view showing lead terminals 2 employed in a conventional taped electronic component.
Figure 7:
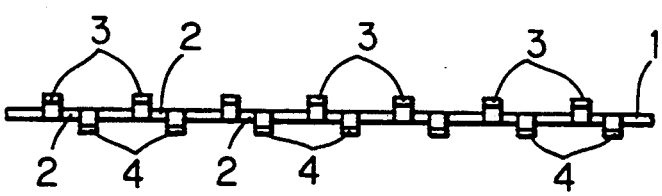
FIG. 7 is a top plan view of the lead terminals 2 as viewed along VII in FIG. 6.
Figure 8:
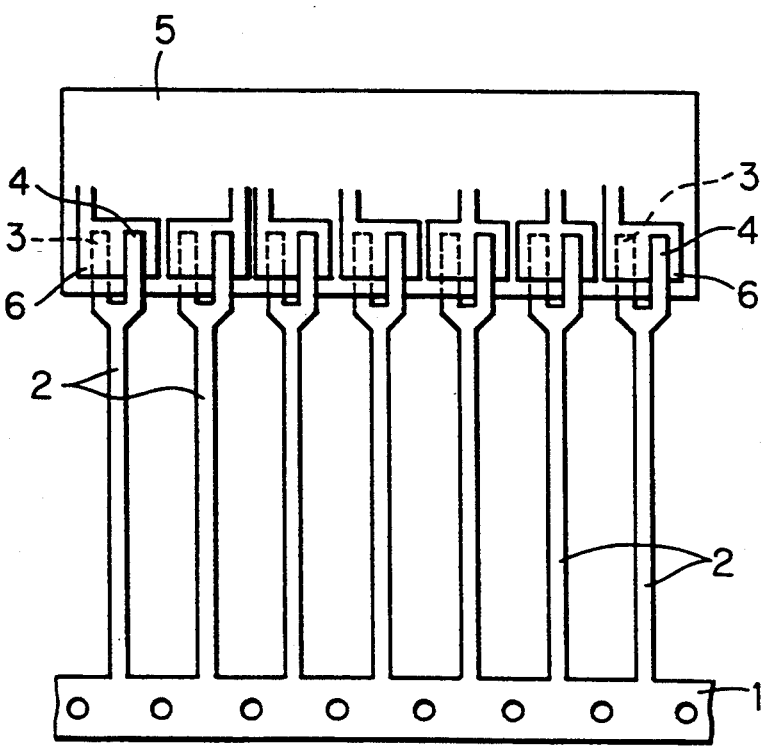
FIG. 8 is a plan view showing the lead terminals 2, appearing in FIG. 6, attached to an electronic component body 5.
Figure 9:
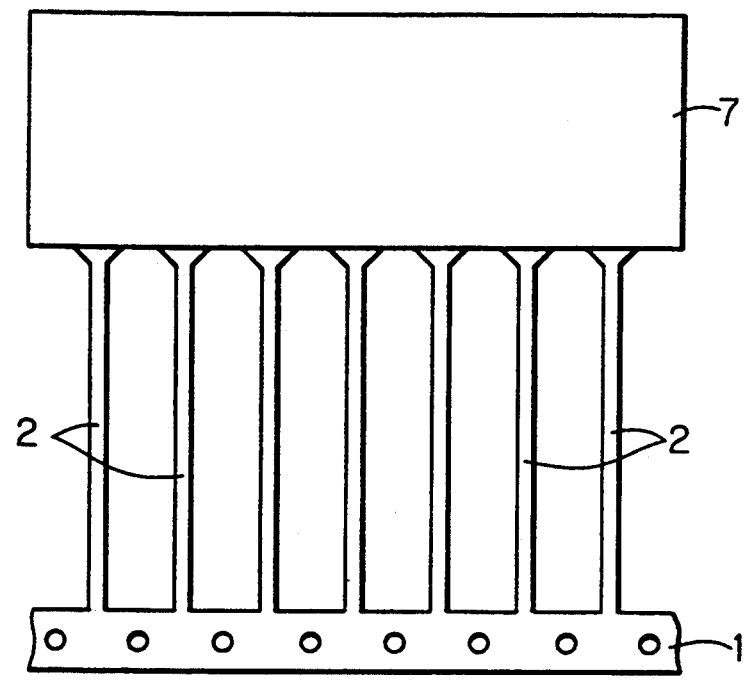
FIG 9 a plan view showing the body 5, appearing in FIG. 8, covered with an insulating coating 7.
Figure 10:
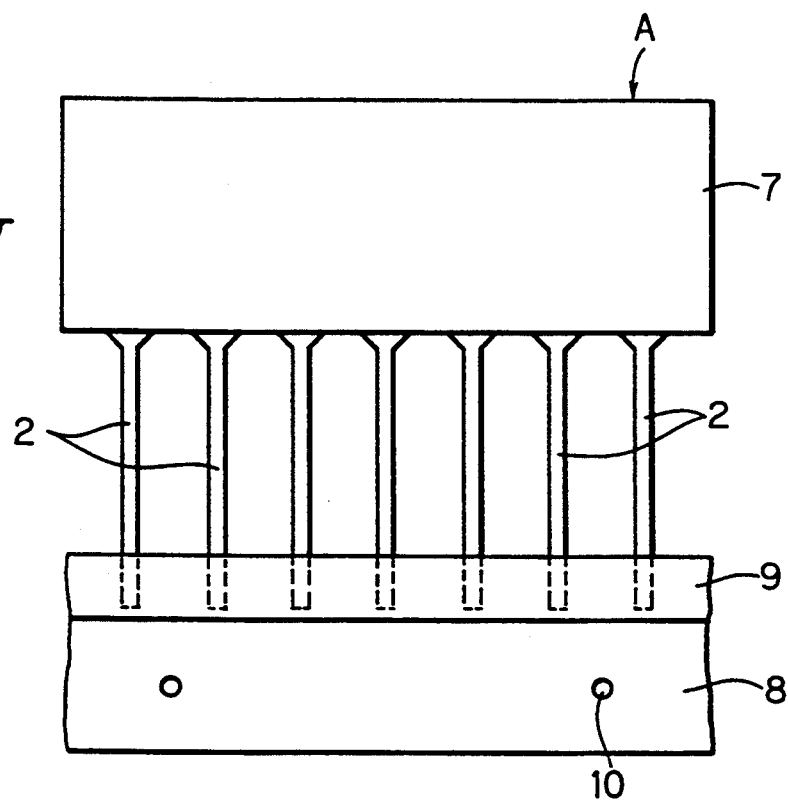
FIG 10 is a plan view showing the finished conventional taped electronic component.
Figure 11:
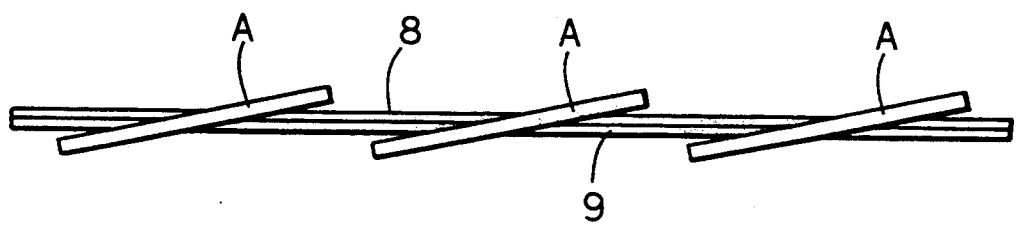
FIG. 11 a top plan view showing distorted states of respective electronic components A included in the taped electronic component shown in FIG. 10.

Then, the connecting member 11 is separated from the terminals 12 and 13 so as to provide an independent electronic component B. The ends of the terminals 12 and 13 forming the electronic component B are placed on a long base tape 21 and attached to this tape 21 with an adhesive tape 22 from above, as shown in FIG. 5. A plurality of such electronic components B are thus fixed onto the base tape 21 at prescribed pitches, to form a taped electronic component.

While single lead terminals 12 and 13 are alternately provided with the respective pairs of holding members 14, 15, 16 and 17, which are bent in opposite modes in the aforementioned embodiment, two or three such lead terminals may be alternately provided. Or, an arrangement of a plurality of such lead terminals may be halved so that the lead terminals 12 of the first group occupy the first half and the lead terminals 13 of the second group occupy the second half. Further, the lead terminals 12 and 13 may not be identical in number to each other. When the lead terminals 12 and 13 are substantially different in number from each other, the electronic component body is somewhat distorted with respect to the base tape by a larger influence exerted by the lead terminals of the larger number. However, the object of the present invention is attained so far as no problem is caused in chucking etc. in the automatic inserter.

In the taped electronic component according to the present invention it is not necessary to attach all lead terminals to the base tape as in the aforementioned embodiment, and those which are not attached to the base tape may be previously reduced in length. It is not necessary to apply the structure characterizing the present invention to such lead terminals which are not attached the base tape.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An assembly of taped electronic components, comprising:
   a base tape; and
   a plurality of electronic components each having an electronic component body and a plurality of lead terminals, each of said lead terminals having a first end and a second end, the first ends of said lead terminals each having a pair of holding members and the second ends of said lead terminals being fixed on said base tape such that said second ends are arranged along a longitudinal direction of said base tape;
   the holding members of each pair of holding members being resilient and spaced apart from each other along the longitudinal direction of the base tape and along a direction perpendicular to a plane defined by said base tape such that a holding clearance, in the perpendicular direction, is defined between the holding members of each of said pair of holding members;
   said electronic component body being resiliently held in the holding clearances of said pairs of holding members,
   said plurality of lead terminals being divided into a first group and a second group, said lead terminals belonging to said first group having holding members that are spaced apart in said direction perpendicular to said plane defined by said base tape according to a first mode, and said lead terminals belonging to said second group having holding members that are spaced apart in said direction perpendicular to said base tape according to a second mode which is different from said first mode.

2. A taped electronic component in accordance with claim 1, wherein said lead terminals belonging to said first group and those belonging to said second group are arranged so as to alternate with each other.

3. A taped electronic component in accordance with claim 1, wherein said lead terminals belonging to said first group are substantially identical in number to those belonging to said second group.

4. An assembly of taped electronic components, comprising:

a base tape; and a plurality of electronic components each having an electronic component body and a plurality of lead terminals, each of said lead terminals having a first end and a second end, the first ends of said lead terminals each having a pair of holding members and the second ends of said lead terminals being fixed on said base tape such that said second ends are arranged along a longitudinal direction of said base tape;

the holding members of each pair of holding members being resilient and spaced apart from each other along the longitudinal direction of the base tape and along a direction perpendicular to a plane defined by said base tape such that a holding clearance, in the perpendicular direction, is defined between the holding members of each of said pair of holding members;

said electronic component body being resiliently held in the holding clearances of said pairs of holding members, said plurality of lead terminals being divided into a first group and a second group, wherein said pairs of holding members each include a first holding member and a second holding member that are bent in opposite directions in relation to said direction perpendicular to said base tape, said first holding members alternating with second holding members along the longitudinal direction of said base tape;

in said first group of lead terminals, said first holding members being bent in a first direction and said second holding members being bent in a second direction, and in said second group of lead terminals, said first holding members being bent in the second direction and said second holding members being bent in the first direction.

5. A taped electronic component in accordance with claim 4, wherein said lead terminals belonging to said first group and those belonging to said second group are arranged so as to alternate with each other.

6. A taped electronic component in accordance with claim 4, wherein said lead terminals belonging to said first group are substantially identical in number to those belonging to said second group.

* * * * *